(12) United States Patent
Ishizuka

(10) Patent No.: US 10,693,389 B2
(45) Date of Patent: Jun. 23, 2020

(54) POWER CONVERSION DEVICE

(71) Applicant: HONDA MOTOR CO., LTD., Minato-ku, Tokyo (JP)

(72) Inventor: Kazuhisa Ishizuka, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/296,268

(22) Filed: Mar. 8, 2019

(65) Prior Publication Data

US 2019/0288608 A1    Sep. 19, 2019

(30) Foreign Application Priority Data

Mar. 15, 2018   (JP) .................................. 2018-047616

(51) Int. Cl.
| | |
|---|---|
| *H02M 7/00* | (2006.01) |
| *H01L 23/00* | (2006.01) |
| *H02M 7/5387* | (2007.01) |
| *H05K 7/20* | (2006.01) |
| *H02M 3/158* | (2006.01) |

(Continued)

(52) U.S. Cl.
CPC ............ *H02M 7/003* (2013.01); *H01L 24/30* (2013.01); *H01L 24/83* (2013.01); *H02M 7/5387* (2013.01); *H05K 7/20945* (2013.01); *B60L 2210/40* (2013.01);
(Continued)

(58) Field of Classification Search
CPC ........................... H02M 7/003; H02M 7/5387; H05K 7/20945; H01L 24/30; H01L 24/83; H01L 2224/73265; B60L 2210/40
See application file for complete search history.

(56) References Cited

U.S. PATENT DOCUMENTS

| | | | |
|---|---|---|---|
| 2017/0194200 A1* | 7/2017 | Bayerer | ................ H01L 23/367 |
| 2018/0269799 A1* | 9/2018 | Kimura | ................. H02M 7/493 |

(Continued)

FOREIGN PATENT DOCUMENTS

| | | |
|---|---|---|
| JP | 2012-235081 | 11/2012 |
| JP | 2017-099231 | 6/2017 |

OTHER PUBLICATIONS

Japanese Office Action for Japanese Patent Application No. 2018-047616 dated Jan. 28, 2020.

*Primary Examiner* — Kyle J Moody
(74) *Attorney, Agent, or Firm* — Amin, Turocy & Watson, LLP

(57) ABSTRACT

A power conversion device includes element array having a high side arm element and a low side arm element, positive electrode-side conductor electrically connected to the high side arm element, negative electrode-side conductor electrically connected to the low side arm element, output-side conductor electrically connected to the high side arm element and the low side arm element, high side driving signal line that controls the high side arm element, and low side driving signal line that controls the low side arm element, the positive electrode-side conductor and the negative electrode-side conductor extend from the element array toward one side in first direction, the output-side conductor extends from the element array toward the other side opposite to the one side in the first direction, and the high side driving signal line and the low side driving signal line extend from the element array toward a second direction crossing the first direction.

4 Claims, 8 Drawing Sheets

(51) Int. Cl.
*H02M 1/00* (2006.01)
*H02M 1/32* (2007.01)

(52) U.S. Cl.
CPC ... *H01L 2224/73265* (2013.01); *H02M 3/158* (2013.01); *H02M 2001/007* (2013.01); *H02M 2001/327* (2013.01)

(56) References Cited

U.S. PATENT DOCUMENTS

2019/0051640 A1* 2/2019 Yano ............... H02M 7/003
2019/0092175 A1* 3/2019 Sainsaulieu ........ H05K 7/20336
2019/0229640 A1* 7/2019 Aichriedler ........... H02M 7/003

* cited by examiner

POWER CONVERSION DEVICE

CROSS-REFERENCE TO RELATED APPLICATION

Priority is claimed on Japanese Patent Application No. 2018-047616, filed Mar. 15, 2018, the content of which is incorporated herein by reference.

BACKGROUND OF THE INVENTION

Field of the Invention

The present invention relates to a power conversion device.

Description of Related Art

In the related art, a semiconductor device that does not require a process of vertically inverting semiconductor elements when the semiconductor elements are disposed is known (for example, see Japanese Unexamined Patent Application, First Publication No. 2012-235081). In the semiconductor device disclosed in Japanese Unexamined Patent Application, First Publication No. 2012-235081, a first semiconductor element and a second semiconductor element are disposed in parallel. In addition, when a thin plate section of a conductor electrically connected to an electrode of the first semiconductor element on an upper surface side is fixed to a thin plate section of a conductor electrically connected to an electrode of a second semiconductor element on a lower surface side, the electrode of the first semiconductor element on the upper surface side is electrically connected to the electrode of the second semiconductor element on the lower surface side.

SUMMARY OF THE INVENTION

Incidentally, in the semiconductor device disclosed in Japanese Unexamined Patent Application, First Publication No. 2012-235081, a positive electrode-side conductor, a negative electrode-side conductor, and an output-side conductor extend from the first semiconductor element and the second semiconductor element toward one side in a first direction. In addition, a control electrode terminal (a driving signal line) configured to drive the first semiconductor element and a control electrode terminal (a driving signal line) configured to drive a second semiconductor element extend from the first semiconductor element and the second semiconductor element toward the other side opposite to one side in the first direction.

That is, in the semiconductor device disclosed in Japanese Unexamined Patent Application, First Publication No. 2012-235081, a direction crossing the first direction is not used as the direction in which the positive electrode-side conductor, the negative electrode-side conductor, the output-side conductor, and the control electrode terminal (the driving signal line) extend.

For this reason, in the semiconductor device disclosed in Japanese Unexamined Patent Application, First Publication No. 2012-235081, parts electrically connected to the positive electrode-side conductor and the negative electrode-side conductor, parts electrically connected to the output-side conductor, and parts electrically connected to the control electrode terminal (the driving signal line) are densely packed.

As a result, in the semiconductor device disclosed in Japanese Unexamined Patent Application, First Publication No. 2012-235081, a process of disposing these parts is complicated. Specifically, a process of wiring and connecting the positive electrode-side conductor, the negative electrode-side conductor, the output-side conductor, and the control electrode terminal (the driving signal line) to the plurality of above-mentioned parts is complicated.

When the complicate wiring connection is realized, the wiring connection members gets lengthened. In addition, when the complicate wiring connection is realized, a space-saving property is decreased.

An aspect of the present invention is directed to providing a power conversion device capable of simplifying disposition of parts wired and connected to a positive electrode-side conductor, a negative electrode-side conductor, an output-side conductor and driving signal lines of elements, and facilitating wiring and connection of the positive electrode-side conductor, the negative electrode-side conductor, the output-side conductor and the driving signal lines of the elements to the parts.

(1) A power conversion device according to an aspect of the present invention includes an element array having a high side arm element and a low side arm element, a positive electrode-side conductor electrically connected to the high side arm element, a negative electrode-side conductor electrically connected to the low side arm element, an output-side conductor electrically connected to the high side arm element and the low side arm element, a high side driving signal line configured to transmit a control signal to control the high side arm element to drive the high side arm element, and a low side driving signal line configured to transmit a control signal to control the low side arm element to drive the low side arm element, wherein the positive electrode-side conductor and the negative electrode-side conductor extend from the element array toward one side in a first direction, the output-side conductor extends from the element array toward the other side opposite to the one side in the first direction, and the high side driving signal line and the low side driving signal line extend from the element array toward a second direction crossing the first direction.

(2) The power conversion device according to the aspect (1) may further include a first substrate and a second substrate, wherein the first substrate may include a first conductive layer disposed to face an electrode of an one-side surface of the high side arm element; a second conductive layer disposed to face an electrode of an one-side surface of the low side arm element; a first electric insulating layer connected to the first conductive layer and the second conductive layer; a third conductive layer disposed at a side opposite to the first conductive layer and the second conductive layer with the first electric insulating layer interposed therebetween; and a second electric insulating layer disposed at a side opposite to the first electric insulating layer with the third conductive layer interposed therebetween, the second substrate may include a fourth conductive layer disposed to face an electrode of an other-side surface of the high side arm element; a fifth conductive layer disposed to face an electrode of an other-side surface of the low side arm element; and a third electric insulating layer connected to the fourth conductive layer and the fifth conductive layer, and one of the positive electrode-side conductor and the negative electrode-side conductor may be connected to any one of the first conductive layer and the second conductive layer and extends toward the one side toward the first direction, the other one of the positive electrode-side conductor and the negative electrode-side conductor may be connected to the third conductive layer and extends toward the one side in the first direction, and the output-side conductor may be connected to the second conductive layer and extends toward the other side in the first direction.

(3) In the power conversion device according to the aspect (2), the fourth conductive layer and the second conductive layer may be electrically connected to each other, and the fifth conductive layer and the third conductive layer may be electrically connected to each other.

(4) In the power conversion device according to the aspect (2) or (3), the first substrate may include a first heat conductive section formed of a conductive material, the first heat conductive section may be disposed at a side opposite to the third conductive layer with the second electric insulating layer interposed therebetween, the second substrate may include a second heat conductive section formed of a conductive material, and the second heat conductive section may be disposed at a side opposite to the fourth conductive layer and the fifth conductive layer with the third electric insulating layer sandwiched therebetween.

(5) A power conversion device according to an aspect of the present invention includes an element array having a high side arm element and a low side arm element; a positive electrode-side conductor electrically connected to the high side arm element; a negative electrode-side conductor electrically connected to the low side arm element; an output-side conductor electrically connected to the high side arm element and the low side arm element; a first substrate; and a second substrate, wherein the first substrate may include a first conductive layer disposed to face an electrode of an one-side surface of the high side arm element; a second conductive layer disposed to face an electrode of an one-side surface of the low side arm element; a first electric insulating layer connected to the first conductive layer and the second conductive layer; a third conductive layer disposed at a side opposite to the first conductive layer and the second conductive layer with the first electric insulating layer interposed therebetween; and a second electric insulating layer disposed at a side opposite to the first electric insulating layer with the third conductive layer interposed therebetween, and the second substrate may include a fourth conductive layer disposed to face an electrode of an other-side surface of the high side arm element; a fifth conductive layer disposed to face an electrode of an other-side surface of the low side arm element; and a third electric insulating layer connected to the fourth conductive layer and the fifth conductive layer, one of the positive electrode-side conductor and the negative electrode-side conductor may be connected to any one of the first conductive layer and the second conductive layer, and the other one of the positive electrode-side conductor and the negative electrode-side conductor may be connected to third conductive layer.

In the power conversion device according to the aspect (1), a direction in which the positive electrode-side conductor and the negative electrode-side conductor extend from the element array, a direction in which the output-side conductor extends from the element array, and a direction in which the high side driving signal line and the low side driving signal line extend from the element array are different from each other.

For this reason, in the power conversion device according to the aspect (1), disposition of parts wired and connected to the positive electrode-side conductor and negative electrode-side conductor, parts wired and connected to the output-side conductor, and parts wired and connected to the high side driving signal line and the low side driving signal line can be simplified, a length of a wiring connection member to these parts can be minimized, and a space-saving property can be improved.

In the power conversion device according to the aspect (2), the first substrate includes the first electric insulating layer and the second electric insulating layer.

For this reason, in the power conversion device according to the aspect (2), a configuration in which the positive electrode-side conductor and the negative electrode-side conductor extend toward one side in the first direction, the output-side conductor extends toward the other side in the first direction, and the high side driving signal line and the low side driving signal line extend toward a second direction crossing the first direction can be realized.

In the power conversion device according to the aspect (3), the fourth conductive layer of the second substrate and the second conductive layer of the first substrate are electrically connected to each other.

For this reason, in the power conversion device according to the aspect (3), a configuration of the element array in which the high side arm element and the low side arm element are electrically connected to each other can be realized.

In the power conversion device according to the aspect (3), the fifth conductive layer of the second substrate and the third conductive layer of the first substrate are electrically connected to each other.

For this reason, in the power conversion device according to the aspect (3), the negative electrode-side conductor can extend in the same direction as the positive electrode-side conductor with no interference with the high side arm element and the low side arm element.

In the power conversion device according to the aspect (4), the first substrate includes the first heat conductive section formed of the conductive material, and the second substrate includes the second heat conductive section formed of the conductive material.

For this reason, in the power conversion device according to the aspect (4), cooling performance of the high side arm element and the low side arm element can be improved in comparison with the case in which the first heat conductive section and the second heat conductive section are not provided.

In the power conversion device according to the aspect (5), the first substrate includes the first electric insulating layer and the second electric insulating layer.

For this reason, in the power conversion device according to the aspect (5), a configuration in which the positive electrode-side conductor and the negative electrode-side conductor extend toward one side in the first direction, the output-side conductor extends toward the other side in the first direction, and the high side driving signal line and the low side driving signal line extend toward the second direction crossing the first direction can be realized.

When the configuration is realized, in the power conversion device according to the aspect (5), disposition of parts wired and connected to the positive electrode-side conductor and the negative electrode-side conductor, parts wired and connected to the output-side conductor, and parts wired and connected to the high side driving signal line and the low side driving signal line can be simplified, a length of a wiring connection member to these parts can be minimized, and a space-reducing property can be improved.

DETAILED DESCRIPTION OF THE INVENTION

Hereinafter, embodiments of a power conversion device of the present invention will be described with reference to the accompanying drawings.

First Embodiment

Figure 1A:
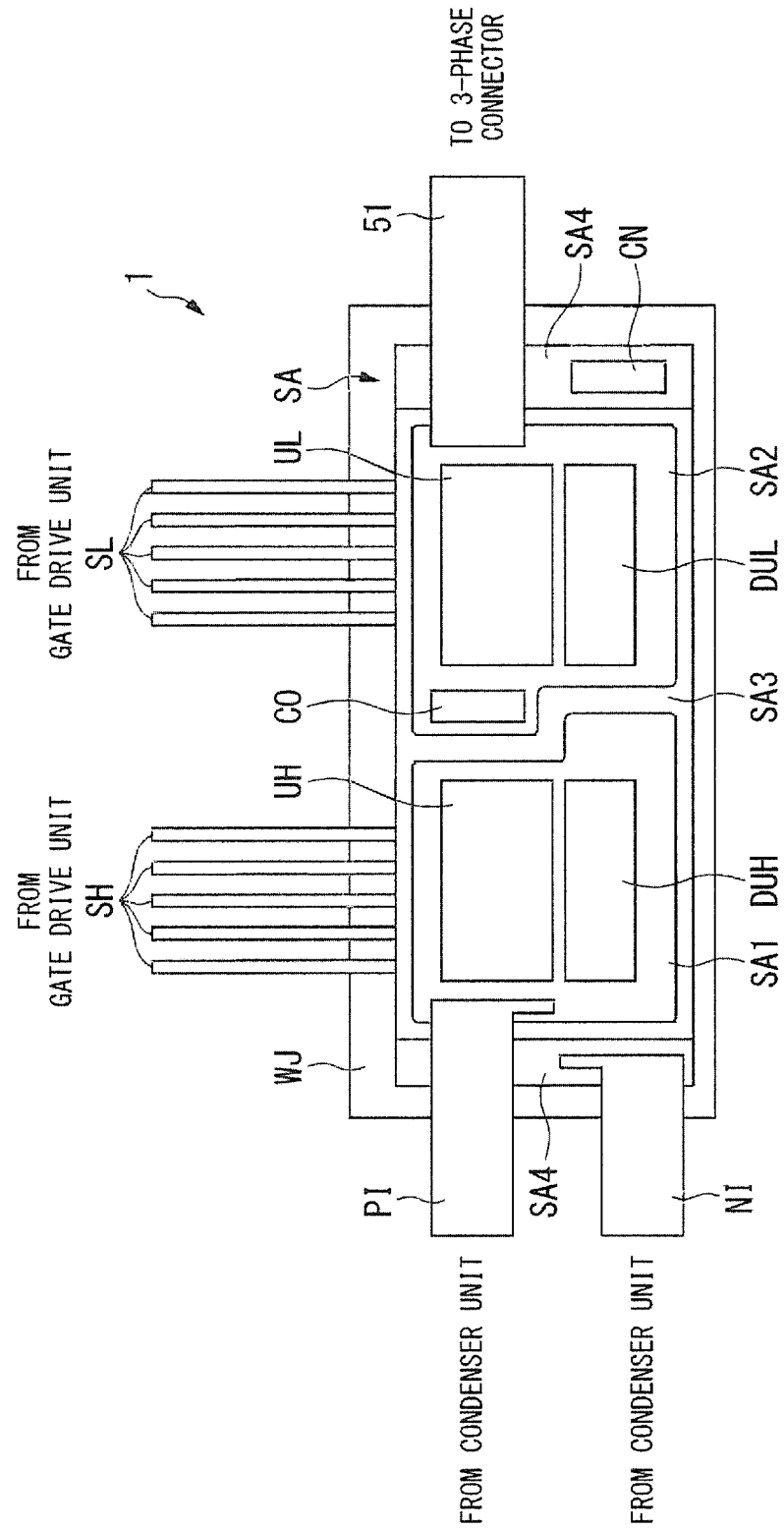
FIG. 1A is a view showing an example of a power conversion device of a first embodiment.
Figure 1B:
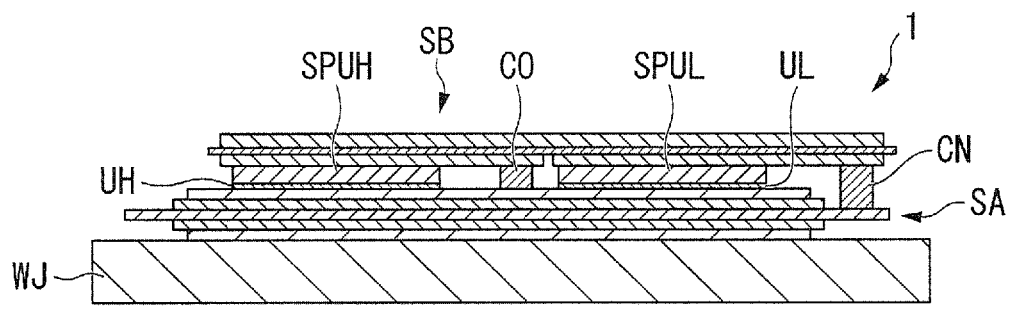
FIG. 1B is a view showing an example of the power conversion device of the first embodiment.
Figure 2:
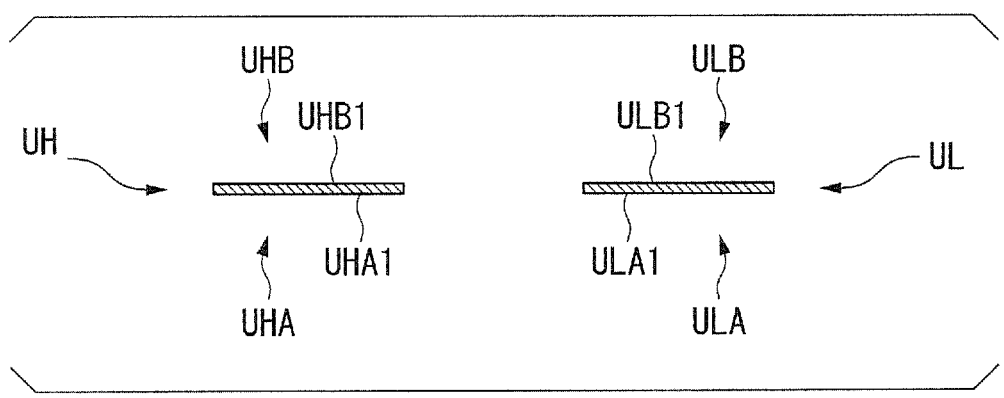
FIG. 2 is a view showing only a high side arm element and a low side arm element, which are extracted, in FIG. 1B.
Figure 3:
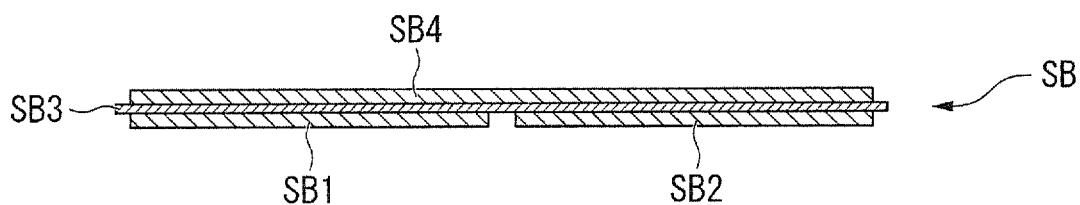
FIG. 3 is a view showing only a substrate on an upper side, which is extracted, in FIG. 1B.
Figure 4:
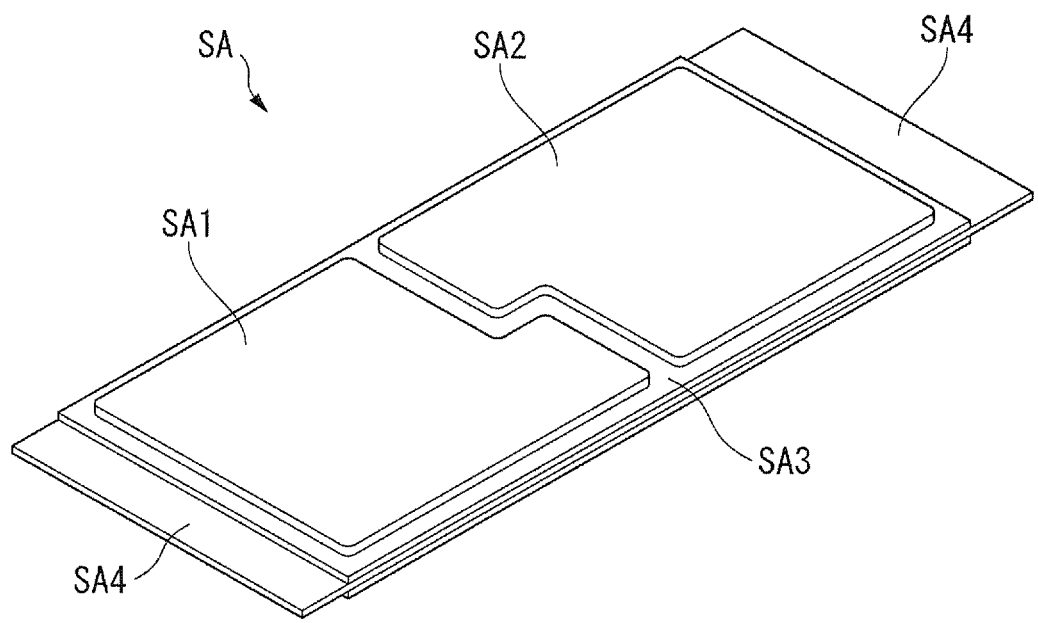
FIG. 4 is a perspective view of a substrate on a lower side shown in FIG. 1A and FIG. 1B.
Figure 5:
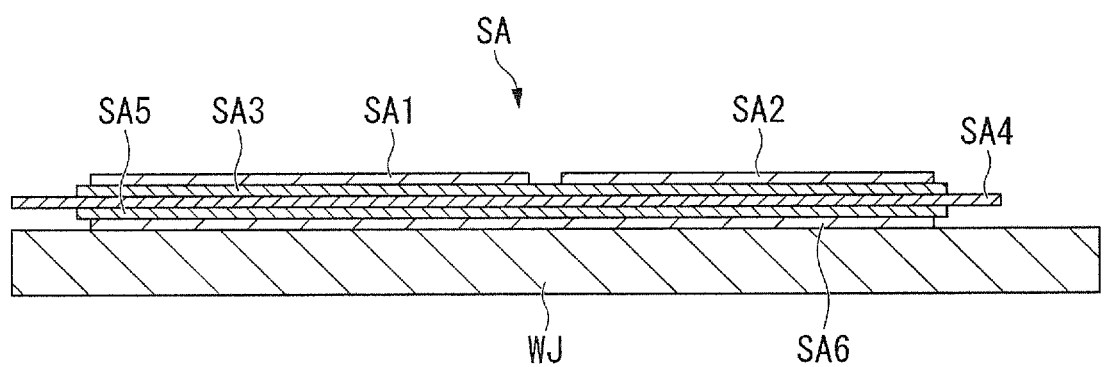
FIG. 5 is a front view of the substrate on the lower side and a radiation section shown in FIG. 1A and FIG. 1B.

FIG. 1A and FIG. 1B are views showing an example of a power conversion device 1 of a first embodiment. Specifically, FIG. 1A is a plan view of the power conversion device 1 of the first embodiment when a substrate SB and spacers SPUH and SPUL are seen therethrough. FIG. 1B is a front view of the power conversion device 1 of the first embodiment. FIG. 2 is a view showing only a high side arm element UH and a low side arm element UL, which are extracted, in FIG. 1B. FIG. 3 is a view showing only the substrate SB, which is extracted, in FIG. 1B. FIG. 4 is a perspective view of a substrate SA shown in FIG. 1A and FIG. 1B. FIG. 5 is a front view of the substrate SA and a radiation section WJ shown in FIG. 1A and FIG. 1B.

In the example shown in FIG. 1A to FIG. 5, the power conversion device 1 includes the high side arm element UH, a flywheel diode DUH connected to the high side arm element UH in reverse in parallel, the low side arm element UL, a flywheel diode DUL connected to the low side arm element UL in reverse parallel, the substrate SA, the substrate SB, a high side driving signal line SH, a low side driving signal line SL, the spacer SPUH, the spacer SPUL, a connecting section CO, a connecting section CN, a positive electrode-side conductor (a P bus bar) PI, a negative electrode-side conductor (an N bus bar) NI, an output-side conductor (an output bus bar) 51, and the radiation section WJ.

The high side arm element UH and the low side arm element UL are switching elements such as an insulated gate bipolar transistor (IGBT), a metal oxide semiconductor field effect transistor (MOSFET), or the like.

The high side arm element UH of one phase extent may be constituted by a plurality of switching elements that are connected in parallel. Similarly, the low side arm element UL of one phase extent may be constituted by a plurality of switching elements that are connected in parallel.

As shown in FIG. 2, an electrode UHA1 is disposed on a surface UHA of the high side arm element UH on one side (a lower side in FIG. 2). An electrode UHB1 and a gate electrode (not shown) to which a driving signal is input are disposed on a surface UHB of the high side arm element UH on the other side (an upper side in FIG. 2). An electrode ULA1 is disposed on a surface ULA of the low side arm element UL on one side (the lower side in FIG. 2). An electrode ULB1 and a gate electrode (not shown) to which a driving signal is input are disposed on a surface ULB of the low side arm element UL on the other side (the upper side in FIG. 2). An element array UHL is constituted by the high side arm element UH and the low side arm element UL. That is, the element array UHL has the high side arm element UH and the low side arm element UL.

In the example shown in FIG. 1A to FIG. 5, the high side arm element UH and the low side arm element UL that constitute the element array UHL are arranged in a leftward/rightward direction in FIG. 1A (i.e., a direction in which the positive electrode-side conductor PI, the negative electrode-side conductor NI and the output-side conductor 51 extend).

As shown in FIG. 3, the substrate SB includes a conductive layer SB1 disposed to face the electrode UHB1 of the high side arm element UH, a conductive layer SB2 disposed to face the electrode ULB1 of the low side arm element UL, an electric insulating layer SB3 connected to the conductive layer SB1 and the conductive layer SB2, and a heat conductive section SB4 disposed on a side opposite to the conductive layer SB1 and the conductive layer SB2 with the electric insulating layer SB3 interposed therebetween. The heat conductive section SB4 is formed of a conductive material.

As shown in FIG. 1B, the spacer SPUH is disposed between the electrode UHB1 of the high side arm element UH and the conductive layer SB1 of the substrate SB. The spacer SPUL is disposed between the electrode ULB1 of the low side arm element UL and the conductive layer SB2 of the substrate SB.

In the example shown in FIG. 1A to FIG. 5, a gate electrode (not shown) of the high side arm element UH is electrically connected to the high side driving signal line SH via, for example, a bonding wire (not shown) or the like. The electrode UHB1 of the high side arm element UH is electrically connected to the conductive layer SB1 of the substrate SB via the spacer SPUH.

A gate electrode (not shown) of the low side arm element UL is electrically connected to the low side driving signal line SL via, for example, a bonding wire (not shown) or the like. The electrode ULB1 of the low side arm element UL is electrically connected to the conductive layer SB2 of the substrate SB via the spacer SPUL.

Figure 10:
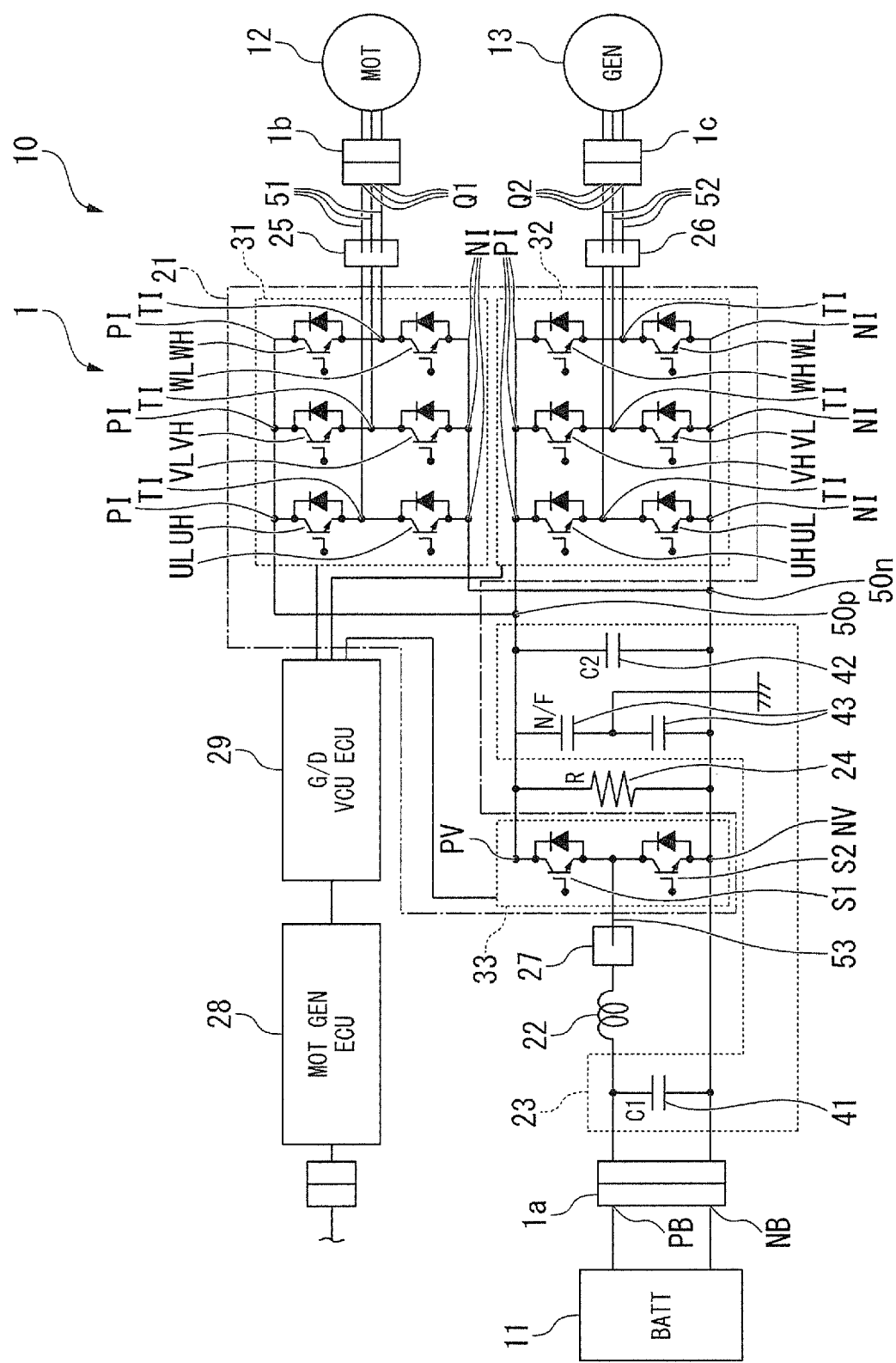
FIG. 10 is a view showing an example of a part of a vehicle to which the power conversion device of the first and second embodiments is applicable.

The high side driving signal line SH and the low side driving signal line SL extend upward from the element array UHL in an upward/downward direction in FIG. 1A (i.e., a direction crossing a leftward/rightward direction), and are wired and connected to a gate drive unit 29 (G/D VCU ECU) (see FIG. 10).

That is, the high side driving signal line SH transmits a control signal that controls to drive the high side arm element UH. The low side driving signal line SL transmits a control signal that controls to drive the low side arm element UL.

As shown in FIG. 4 and FIG. 5, the substrate SA includes a conductive layer SA1, a conductive layer SA2, an electric insulating layer SA3, a conductive layer SA4, an electric insulating layer SA5 and a heat conductive section SA6.

The conductive layer SA1 is disposed to face the electrode UHA1 of the high side arm element UH.

The conductive layer SA2 is disposed to face the electrode ULA1 of the low side arm element UL.

The electric insulating layer SA3 is connected to the conductive layer SA1 and the conductive layer SA2. The conductive layer SA4 is disposed at a side opposite to the conductive layer SA1 and the conductive layer SA2 with the electric insulating layer SA3 interposed therebetween. The electric insulating layer SA5 is disposed at a side opposite to the electric insulating layer SA3 with the conductive layer SA4 interposed therebetween. The heat conductive section SA6 formed of a conductive material is disposed at a side opposite to the conductive layer SA4 with the electric insulating layer SA5 interposed therebetween. The heat conductive section SA6 is connected to the radiation section WJ.

In the example shown in FIG. 1A to FIG. 5, the electrode UHA1 of the high side arm element UH is electrically connected to the conductive layer SA1 of the substrate SA. The electrode ULA1 of the low side arm element UL is electrically connected to the conductive layer SA2 of the substrate SA.

As shown in FIG. 1A, the positive electrode-side conductor PI is electrically connected to the conductive layer SA1 of the substrate SA. That is, the positive electrode-side conductor PI is electrically connected to the electrode UHA1 of the high side arm element UH. Specifically, the positive electrode-side conductor PI extends leftward from the element array UHL in a leftward/rightward direction of FIG. 1A and is wired and connected to a positive electrode bus bar 50*p* (see FIG. 10) of a condenser unit 23 (see FIG. 10).

As shown in FIG. 1A and FIG. 1B, the conductive layer SB1 of the substrate SB electrically connected to the electrode UHB1 of the high side arm element UH is electrically connected to the conductive layer SA2 of the substrate SA via the connecting section CO. The output-side conductor 51 is electrically connected to the conductive layer SA2 of the substrate SA. In addition, the electrode ULA1 of the low side arm element UL is electrically connected to the conductive layer SA2 of the substrate SA. That is, the output-side conductor 51 is electrically connected to the electrode UHB1 of the high side arm element UH and the electrode ULA1 of the low side arm element UL. Specifically, the output-side conductor 51 extends rightward from the element array UHL in the leftward/rightward direction of FIG. 1A and is wired and connected to a 3-phase connector 1*b* (see FIG. 10) connected to a motor 12 (see FIG. 10).

In the example shown in FIG. 1A and FIG. 1B, current flowing from the positive electrode-side conductor PI to the conductive layer SA1 of the substrate SA flows from the electrode UHA1 (see FIG. 2) of the high side arm element UH to the electrode UHB1 (see FIG. 2), then flows from the conductive layer SB1 (see FIG. 3) of the substrate SB to the connecting section CO, and then flows from the conductive layer SA2 of the substrate SA to the output-side conductor 51.

Current flowing from the output-side conductor 51 to the conductive layer SA2 of the substrate SA flows from the electrode ULA1 (see FIG. 2) of the low side arm element UL to the electrode ULB1 (see FIG. 2), then flows from the conductive layer SB2 (see FIG. 3) of the substrate SB to the connecting section CN, and then flows from the conductive layer SA4 of the substrate SA to the negative electrode-side conductor NI.

In another example, it is also possible to exchange between the position of the high side arm element UH and the position of the low side arm element UL (i.e., connect the positive electrode-side conductor PI to the conductive layer SA4) while exchanging between the position of the positive electrode-side conductor PI and the position of the negative electrode-side conductor NI.

As shown in FIG. 1A and FIG. 1B, the conductive layer SB2 of the substrate SB electrically connected to the electrode ULB1 of the low side arm element UL is electrically connected to the conductive layer SA4 of the substrate SA via the connecting section CN. The negative electrode-side conductor NI is electrically connected to the conductive layer SA4 of the substrate SA. That is, the negative electrode-side conductor NI is electrically connected to the electrode ULB1 of the low side arm element UL. Specifically, the negative electrode-side conductor NI extends leftward from the element array UHL in the leftward/rightward direction of FIG. 1A and is wired and connected to a negative electrode bus bar 50*n* (see FIG. 10) of the condenser unit 23 (see FIG. 10).

That is, as shown in FIG. 1B and FIG. 5, the conductive layer SA4 electrically connected to the negative electrode-side conductor NI is disposed in the middle of a heat radiation path (a heat radiation path extending from an upper side to a lower side of FIG. 1B and FIG. 5) spanning from the high side arm element UH and the low side arm element UL to the radiation section WJ and a space-saving property is improved.

In the power conversion device 1 of the first embodiment, as shown in FIG. 1A, a direction in which the positive electrode-side conductor PI and the negative electrode-side conductor NI extend from the element array UHL (a leftward direction in FIG. 1A), a direction in which the output-side conductor 51 extends from an element array UL (a rightward direction in FIG. 1A) and a direction in which the high side driving signal line SH and the low side driving signal line SL extend from the element array UHL (an upward direction in FIG. 1A) are different from each other.

For this reason, in the power conversion device 1 of the first embodiment, disposition of the condenser unit 23 (see FIG. 10) wired and connected to the positive electrode-side conductor PI and the negative electrode-side conductor NI, the 3-phase connector 1*b* (see FIG. 10) wired and connected to the output-side conductor 51, and the gate drive unit 29 (see FIG. 10) wired and connected to the high side driving signal line SH and the low side driving signal line SL can be simplified, a length of a wiring connection member to these can be minimized, and a space-saving property can be improved.

In addition, in the power conversion device 1 of the first embodiment, it is possible to minimize the possibility that a complicated bus bar structure configured to wire and connect the positive electrode-side conductor PI and the negative electrode-side conductor NI to the output-side conductor 51 is required, and it is possible to facilitate wiring connection of the condenser unit 23 to the positive electrode-side conductor PI and the negative electrode-side conductor NI and wiring connection of the 3-phase connector 1*b* to the output-side conductor 51.

In addition, in the power conversion device 1 of the first embodiment, as shown in FIG. 5, the substrate SA includes the electric insulating layer SA3 and the electric insulating layer SA5.

For this reason, in the power conversion device 1 of the first embodiment, it is possible to realize a configuration in which the positive electrode-side conductor PI and the negative electrode-side conductor NI extend leftward in FIG. 1A, the output-side conductor 51 extends rightward in FIG. 1A, and the high side driving signal line SH and the low side driving signal line SL extend upward in FIG. 1A.

Specifically, in the power conversion device 1 of the first embodiment, as shown in FIG. 1A and FIG. 1B, the conductive layer SB1 of the substrate SB and the conductive layer SA2 of the substrate SA are electrically connected via the connecting section CO. For this reason, in the power conversion device 1 of the first embodiment, it is possible to realize a configuration of the element array UHL in which the high side arm element UH and the low side arm element UL are electrically connected.

In addition, in the power conversion device 1 of the first embodiment, the conductive layer SB2 of the substrate SB and the conductive layer SA4 of the substrate SA are electrically connected via the connecting section CN. For this reason, in the power conversion device 1 of the first embodiment, the negative electrode-side conductor NI can extend in the same direction as the positive electrode-side conductor PI (in the leftward direction of FIG. 1A) with no interference with the high side arm element UH and the low side arm element UL.

In the power conversion device 1 of the first embodiment, as shown in FIG. 5, the substrate SA includes the heat conductive section SA6 formed of a conductive material. In addition, as shown in FIG. 1B and FIG. 3, the substrate SB includes the heat conductive section SB4 formed of a conductive material.

For this reason, in the power conversion device 1 of the first embodiment, cooling performance of the high side arm element UH and the low side arm element UL can be improved in comparison with the case in which the heat conductive section SA6 and the heat conductive section SB4 are not provided.

In other words, in the power conversion device 1 of the first embodiment, the substrate SA has five layers in the upward/downward direction of FIG. 5. Specifically, the uppermost layer is the conductive layer SA1 and the conductive layer SA2, a second layer from above is the electric insulating layer SA3, a third layer from above is the conductive layer SA4, a fourth layer from above is the electric insulating layer SA5, and the lowermost layer is a heat conductive section SA5.

When the substrate SA is used, in the power conversion device 1 of the first embodiment, a direction in which the positive electrode-side conductor PI and the negative electrode-side conductor NI extend and a direction in which the output-side conductor 51 extends are different from each other. As a result, wiring connection of the condenser unit 23 (see FIG. 10) with respect to the positive electrode-side conductor PI and the negative electrode-side conductor NI and wiring connection of the 3-phase connector 1b (see FIG. 10) with respect to the output-side conductor 51 can be performed in a small space.

In addition, the conductive layer SA4 electrically connected to the negative electrode-side conductor NI is sandwiched between the high side arm element UH and the low side arm element UL and the radiation section WJ and is disposed on a heat radiation path from the high side arm element UH and the low side arm element UL to the radiation section WJ. For this reason, formation of a circuit in a small space can be performed.

In the power conversion device 1 of the first embodiment, as shown in FIG. 1A, electrical connection to the positive electrode-side conductor PI and the negative electrode-side conductor NI is performed at a left side of the substrate SA having a rectangular shape, electrical connection to the output-side conductor 51 is performed at a right side of the substrate SA, and electrical connection to the high side driving signal line SH and the low side driving signal line SL is performed at an upper side of the substrate SA.

For this reason, in the power conversion device 1 of the first embodiment, it is possible to minimize a possibility of mutual interference between a path of the substrate and the motor, a possibility of containing noise in a driving signal, and a possibility of making it difficult to take a control timing using a high side arm and a low side arm while not being controlled by one substrate as the high side driving signal line and the low side driving signal line extend in different directions.

In the power conversion device 1 of the first embodiment, wiring connection to the condenser unit 23, the 3-phase connector 1b and the gate drive unit 29 can be performed at the shortest distance, and wiring connection to the condenser unit 23, the 3-phase connector 1b, and the gate drive unit 29 can be performed by a simple structure. That is, in the power conversion device 1 of the first embodiment, the condenser unit 23, the 3-phase connector 1b, and the gate drive unit 29 can be easily disposed around the power conversion device 1.

In addition, in the power conversion device 1 of the first embodiment, as shown in FIG. 5, a right end portion of the conductive layer SA4 of the substrate SA protrudes rightward from right end portions of the electric insulating layers SA3 and SA5 to be exposed.

The exposed right end portion of the conductive layer SA4 is used for electrical connection to the connecting section CN.

In addition, the left end portion of the conductive layer SA4 of the substrate SA protrudes leftward from left end portions of the electric insulating layers SA3 and SA5 to be exposed. The exposed left end portion of the conductive layer SA4 is used for electrical connection to the negative electrode-side conductor NI.

In the power conversion device 1 of the first embodiment, as shown in FIG. 5, the substrate SA has the plurality of electric insulating layers SA3 and SA5. The conductive layer SA4 that constitutes a circuit is assembled between the electric insulating layer SA3 and the electric insulating layer SA5. For this reason, as described above, electrical connection to the positive electrode-side conductor PI and the negative electrode-side conductor NI is performed at a left side of the substrate SA having a rectangular shape. In addition, electrical connection to the output-side conductor 51 is performed at a right side facing the left side of the substrate SA.

Electrical connection to the high side driving signal line SH and the low side driving signal line SL is performed intensively on an upper side, which is neither the left side nor the right side of the substrate SA.

As described above, the positive electrode-side conductor PI and the negative electrode-side conductor NI are wired and connected to the condenser unit 23, and the output-side conductor 51 is wired and connected to the 3-phase connector 1b. A circuit substrate that constitutes the gate drive unit 29 is disposed above or below the substrate SA of the power conversion device 1 in FIG. 5 in a surface perpendicular to the substrates SA and SB of the power conversion device 1. As a result, wiring connection from the power conversion device 1 to the condenser unit 23, wiring connection from the power conversion device 1 to the 3-phase connector 1b, and wiring connection from the power conversion device 1 to the gate drive unit 29 can be intensively arranged at a short distance.

Second Embodiment

Hereinafter, a second embodiment of the power conversion device 1 of the present invention will be described.

The power conversion device 1 of the second embodiment is constituted by the same configuration as the power conversion device 1 of the above-mentioned first embodiment except the following points. Accordingly, according to the power conversion device 1 of the second embodiment, the same effect as the power conversion device 1 of the above-mentioned first embodiment can be exhibited except the following points.

Figure 6:
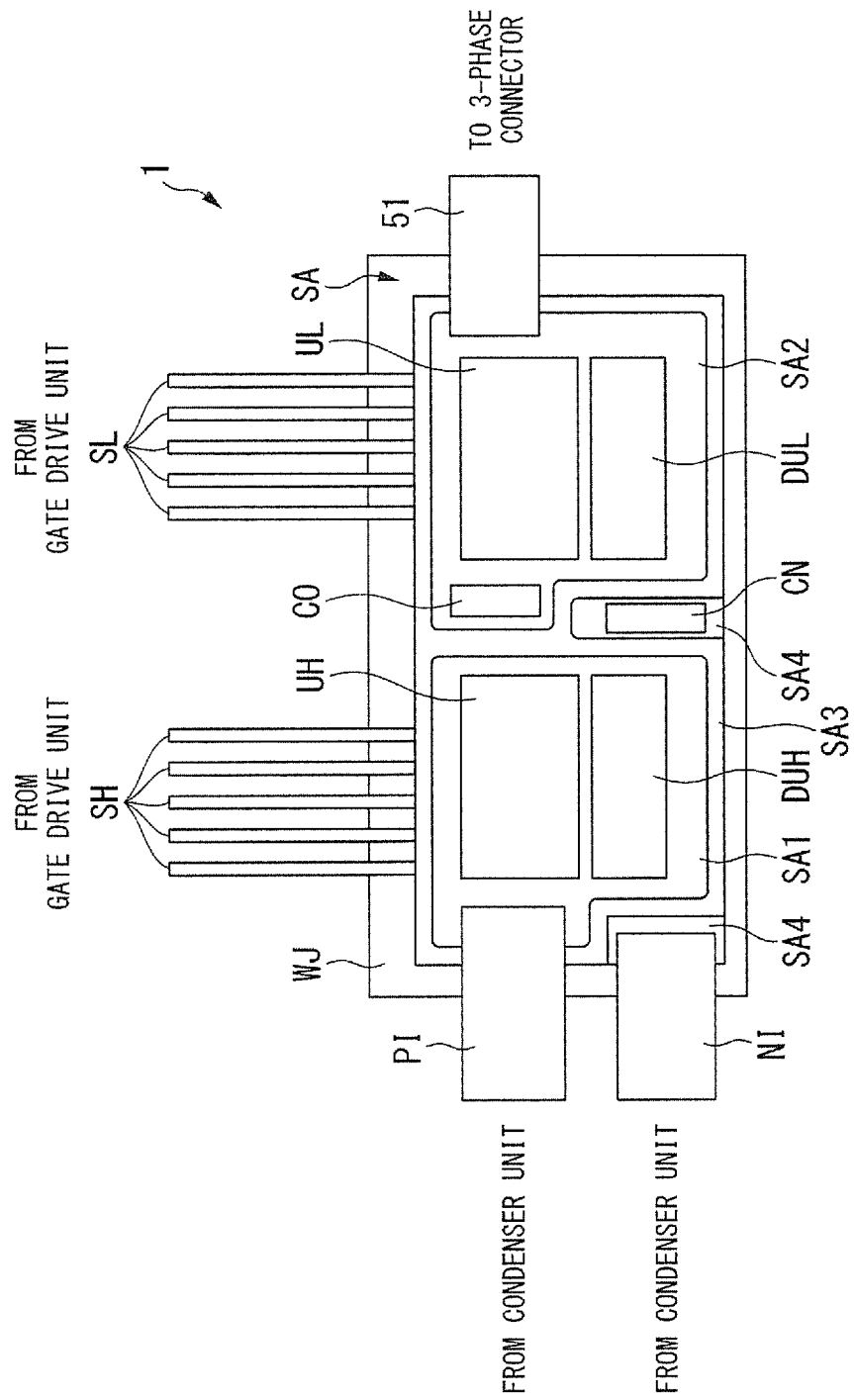
FIG. 6 is a view showing an example of a power conversion device of a second embodiment.
Figure 7A:
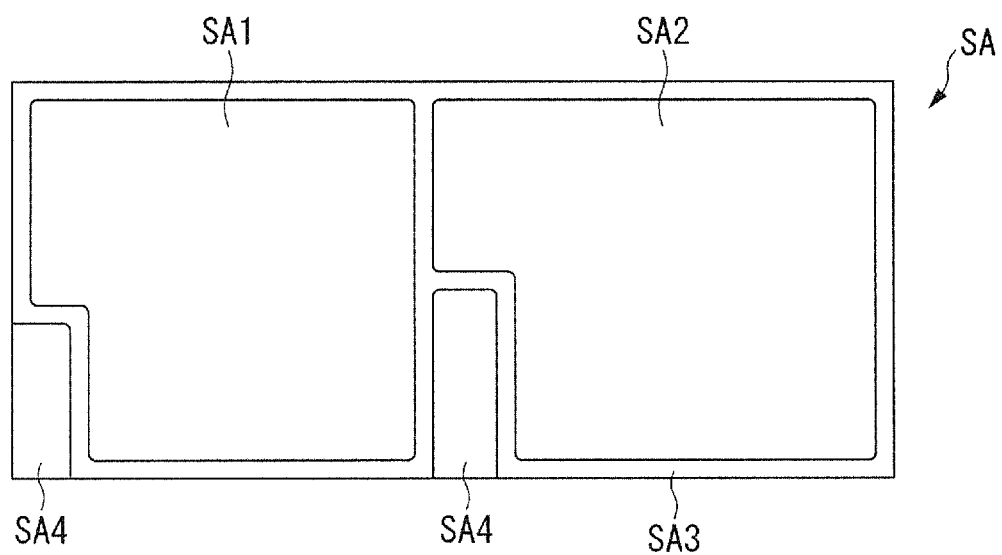
FIG. 7A is a view showing parts of a substrate shown in FIG. 6.
Figure 7B:
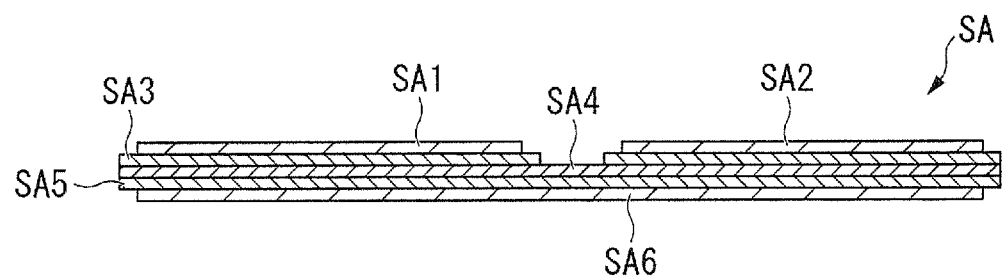
FIG. 7B is a view showing parts of the substrate shown in FIG. 6.
Figure 8:
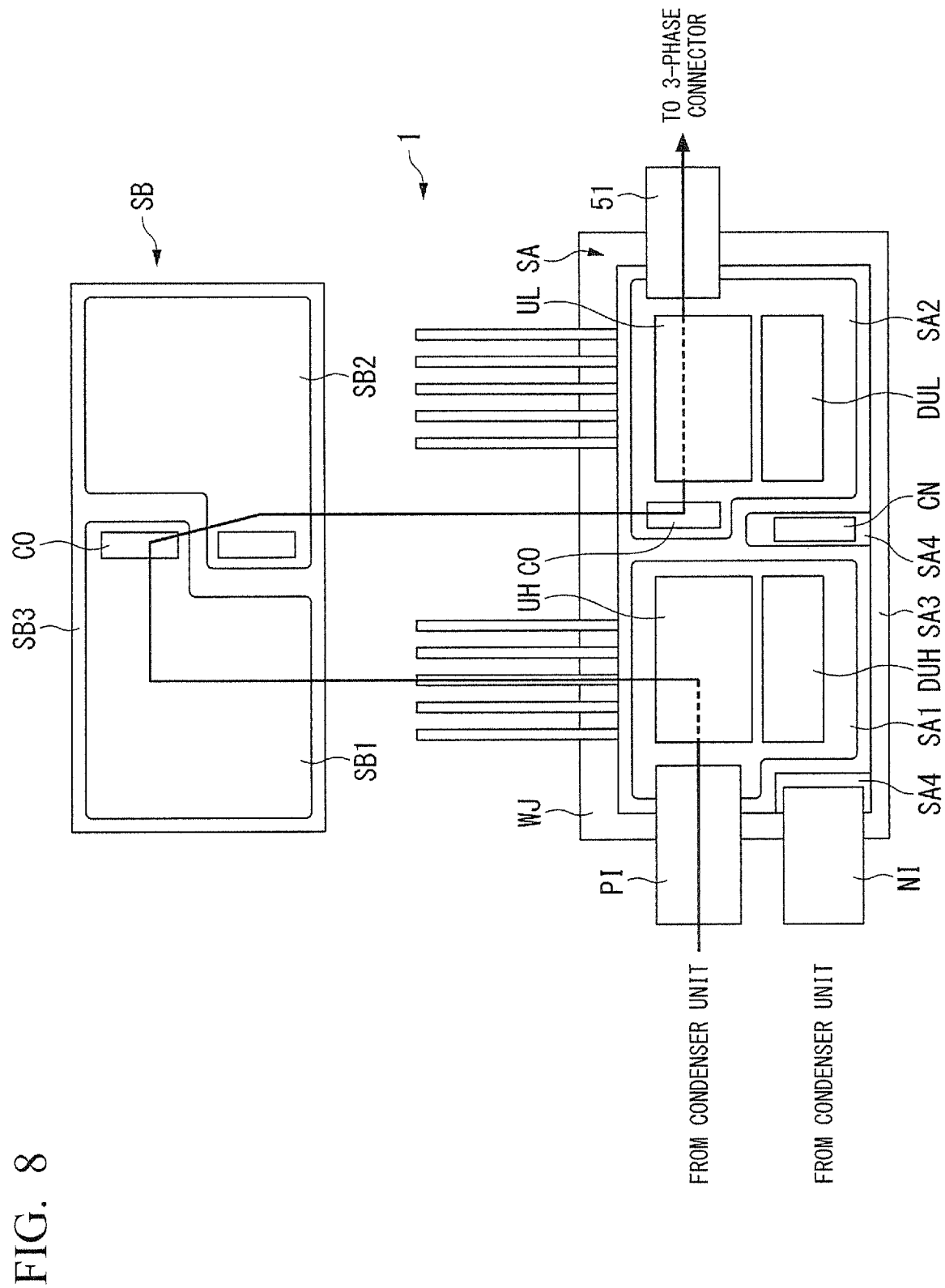
FIG. 8 is a view for explaining a current path from a positive electrode-side conductor to an output-side conductor.
Figure 9:
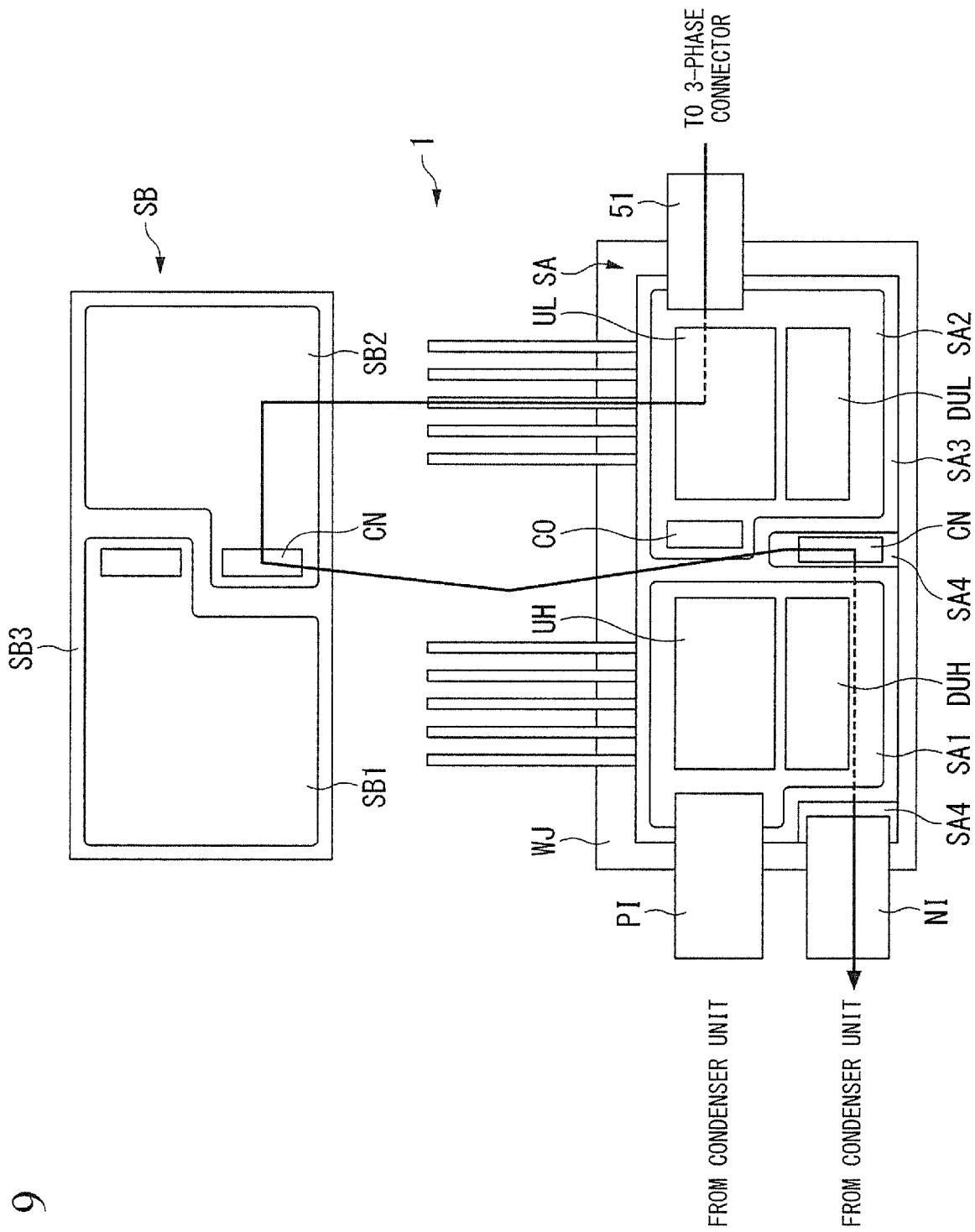
FIG. 9 is a view for explaining a current path from the output-side conductor to a negative electrode-side conductor.

FIG. 6 is a view showing an example of the power conversion device 1 of the second embodiment. Specifically, FIG. 6 is a plan view of the power conversion device 1 of the second embodiment when the substrate SB and the spacers SPUH and SPUL are seen therethrough. FIG. 7A and FIG. 7B are views showing parts of the substrate SA shown in FIG. 6. Specifically, FIG. 7A is a plan view of the substrate SA and FIG. 7B is a front view of the substrate SA. FIG. 8 is a view for explaining a current path from the positive electrode-side conductor PI to the output-side conductor 51. FIG. 9 is a view for explaining a current path from the output-side conductor 51 to the negative electrode-side conductor NI.

In the power conversion device 1 of the first embodiment, as shown in FIG. 5, the right end portion of the conductive layer SA4 of the substrate SA protrudes rightward from the right end portions of the electric insulating layers SA3 and SA5 to be exposed. The left end portion of the conductive layer SA4 of the substrate SA protrudes leftward from the left end portions of the electric insulating layers SA3 and SA5 to be exposed.

In the power conversion device 1 of the second embodiment, as shown in FIG. 7B, the right end portion of the conductive layer SA4 of the substrate SA and the right end portions of the electric insulating layers SA3 and SA5 are disposed at the same position in the leftward/rightward direction of FIG. 7B. The left end portion of the conductive layer SA4 of the substrate SA and the left end portions of the electric insulating layers SA3 and SA5 are disposed at the same position in the leftward/rightward direction of FIG. 7B.

In the power conversion device 1 of the second embodiment, as shown in FIG. 6 and FIG. 7A, in order to perform electrical connection to the conductive layer SA4 and the connecting section CN, a central section of the electric insulating layer SA3 in the leftward/rightward direction of FIG. 6 and FIG. 7A is cut out, and a central section of the conductive layer SA4 in the leftward/rightward direction of FIG. 6 and FIG. 7A is exposed. In addition, in order to perform electrical connection of the conductive layer SA4 and the negative electrode-side conductor NI, a left end portion of the electric insulating layer SA3 in the leftward/rightward direction of FIG. 6 and FIG. 7A is cut out, and a left end portion of the conductive layer SA4 in the leftward/rightward direction of FIG. 6 and FIG. 7A is exposed.

That is, in the power conversion device 1 of the second embodiment, a width dimension (a dimension in the leftward/rightward direction of FIG. 7A and FIG. 7B) of the substrate SA is reduced to be smaller than the power conversion device 1 of the first embodiment.

Accordingly, in the power conversion device 1 of the second embodiment, the entire width dimension (the dimension in the leftward/rightward direction of FIG. 6) of the power conversion device 1 is reduced to be smaller than the power conversion device 1 of the first embodiment.

As shown in FIG. 8, current flowing from the positive electrode-side conductor PI to the conductive layer SA1 of the substrate SA flows from the electrode UHA1 (see FIG. 2) of the high side arm element UH to the electrode UHB1 (see FIG. 2), then flows from the conductive layer SB1 of the substrate SB to the connecting section CO, and then flows from the conductive layer SA2 of the substrate SA to the output-side conductor 51.

As shown in FIG. 9, current flowing from the output-side conductor 51 to the conductive layer SA2 of the substrate SA flows from the electrode ULA1 (see FIG. 2) of the low side arm element UL to the electrode ULB1 (see FIG. 2), then flows from the conductive layer SB2 of the substrate SB to the connecting section CN, and then flows from the conductive layer SA4 of the substrate SA to the negative electrode-side conductor NI.

In FIG. 8 and FIG. 9, illustration of the heat conductive section SB4 of the substrate SB is omitted, and an outline of the conductive layer SB1 of the substrate SB and an outline of the conductive layer SB2 of the substrate SB are shown through the electric insulating layer SB3 of the substrate SB.

In another example, it is also possible to change between the position of the high side arm element UH and the position of the low side arm element UL (i.e., connect the positive electrode-side conductor PI to the conductive layer SA4) while changing between the position of the positive electrode-side conductor PI and the position of the negative electrode-side conductor NI.

APPLICATION EXAMPLE

Hereinafter, an application example of the power conversion device 1 of the present invention will be described with reference to the accompanying drawings.

FIG. 10 is a view showing an example of part of a vehicle 10 to which the power conversion device 1 of the first or second embodiment is applicable.

When the power conversion device 1 of the first or second embodiment is applied to the example shown in FIG. 10, seven power conversion devices 1 of the first or second embodiment are used in the vehicle 10 shown in FIG. 10.

In the example shown in FIG. 10, the vehicle 10 includes a battery 11 (BATT), a first motor 12 (MOT) for traveling and driving, and a second motor 13 (GEN) for generation in addition to the power conversion device 1.

The battery 11 includes a battery case and a plurality of battery modules accommodated in the battery case. The battery module includes a plurality of battery cells connected to each other in series. The battery 11 includes a positive electrode terminal PB and a negative electrode terminal NB, which are connected to a direct current connector 1a of the power conversion device 1. The positive electrode terminal PB and the negative electrode terminal NB are connected to positive electrode ends and negative electrode ends of the plurality of battery modules, which are connected in series in the battery case.

The first motor 12 generates a rotational driving force (a power-run operation) using electric power supplied from the battery 11. The second motor 13 generates electric power using a rotational driving force input to the rotary shaft. Here, rotational power of an internal combustion engine is configured to be transmittable to the second motor 13. For example, each of the first motor 12 and the second motor 13 is an alternating brushless direct current (DC) motor having three phases. The three phases are a U phase, a V phase, and a W phase. Each of the first motor 12 and the second motor 13 is an inner rotor type. Each of the first motor 12 and the second motor 13 includes a rotator having a permanent magnet for a field system, and a stator having a 3-phase stator winding configured to generate a rotating magnetic field that rotates the rotator. The 3-phase stator winding of the first motor 12 is connected to the first 3-phase connector 1b of the power conversion device 1. The 3-phase stator winding of the second motor 13 is connected to the second 3-phase connector 1c of the power conversion device 1.

The power conversion device 1 shown in FIG. 10 includes a power module 21, a reactor 22, the condenser unit 23, a resistor 24, a first current sensor 25, a second current sensor 26, a third current sensor 27, an electronic control unit 28 (MOT GEN ECU) and the gate drive unit 29.

The power module 21 includes a first power conversion circuit section 31, a second power conversion circuit section 32 and a third power conversion circuit section 33.

When the seven power conversion devices 1 of the first or second embodiment are used in the vehicle 10 shown in FIG. 10, the first power conversion circuit section 31 is constituted by the three power conversion devices 1 of the first or second embodiment.

Specifically, the first power conversion device 1 of the first or second embodiment constitutes a U phase of the first power conversion circuit section 31. The second power conversion device 1 of the first or second embodiment constitutes a V phase of the first power conversion circuit section 31. The third power conversion device 1 of the first or second embodiment constitutes a W phase of the first power conversion circuit section 31.

The output-side conductor 51 of the first power conversion circuit section 31 is connected to the first 3-phase connector 1b by combining three phases of a U phase, a V phase, and a W phase. That is, the output-side conductor 51 of the first power conversion circuit section 31 is connected to the 3-phase stator winding of the first motor 12 via the first 3-phase connector 1b.

The positive electrode-side conductor PI of the first power conversion circuit section 31 is connected to the positive electrode terminal PB of the battery 11 by combining three phases of a U phase, a V phase, and a W phase.

The negative electrode-side conductor NI of the first power conversion circuit section 31 is connected to the negative electrode terminal NB of the battery 11 by combining three phases of a U phase, a V phase, and a W phase.

That is, the first power conversion circuit section 31 converts direct current power input from the battery 11 via the third power conversion circuit section 33 into 3-phase alternating current power.

When the seven power conversion devices 1 of the first or second embodiment are used in the vehicle 10 shown in FIG. 10, the second power conversion circuit section 32 is constituted by the three power conversion devices 1 of the first or second embodiment.

Specifically, the first power conversion device 1 of the first or second embodiment constitutes a U phase of the second power conversion circuit section 32. The second power conversion device 1 of the first or second embodiment constitutes a V phase of the second power conversion circuit section 32. The third power conversion device 1 of the first or second embodiment constitutes a W phase of the second power conversion circuit section 32.

An output-side conductor (an output bus bar) 52 of the second power conversion circuit section 32 is connected to the second 3-phase connector 1c by combining three phases of a U phase, a V phase, and a W phase. That is, the output-side conductor 52 of the second power conversion circuit section 32 is connected to the 3-phase stator winding of the second motor 13 via the second 3-phase connector 1c.

The positive electrode-side conductor PI of the second power conversion circuit section 32 is connected to the positive electrode terminal PB of the battery 11 and the positive electrode-side conductor PI of the first power conversion circuit section 31 by combining three phases of a U phase, a V phase, and a W phase.

The negative electrode-side conductor NI of the second power conversion circuit section 32 is connected to the negative electrode terminal NB of the battery 11 and the negative electrode-side conductor NI of the second power conversion circuit section 32 by combining three phases of a U phase, a V phase, and a W phase The second power conversion circuit section 32 converts the 3-phase alternating current power input from the second motor 13 into direct current power. The direct current power converted by the second power conversion circuit section 32 can be supplied to at least one of the battery 11 and the first power conversion circuit section 31.

In the example shown in FIG. 10, a U phase high side arm element UH, a V phase high side arm element VH, and a W phase high side arm element WH of the first power conversion circuit section 31 and a U phase high side arm element UH, a V phase high side arm element VH, and a W phase high side arm element WH of the second power conversion circuit section 32 are connected to the positive electrode-side conductor PI. The positive electrode-side conductor PI is connected to the positive electrode bus bar 50p of the condenser unit 23.

A U phase low side arm element UL, a V phase low side arm element VL, and a W phase low side arm element WL of the first power conversion circuit section 31 and a U phase low side arm element UL, a V phase low side arm element VL, and a W phase low side arm element WL of the second power conversion circuit section 32 are connected to the negative electrode-side conductor NI. The negative electrode-side conductor NI is connected to the negative electrode bus bar 50n of the condenser unit 23.

In the example shown in FIG. 10, a connecting point TI between the U phase high side arm element UH of the first power conversion circuit section 31 and the U phase low side arm element UL, a connecting point TI between the V phase high side arm element VH and the V phase low side arm element VL, and a connecting point TI between the W phase high side arm element WH and the W phase low side arm element WL are connected to the output-side conductor 51.

A connecting point TI between the U phase high side arm element UH of the second power conversion circuit section 32 and the U phase low side arm element UL, a connecting point TI between the V phase high side arm element VH and the V phase low side arm element VL, and a connecting point TI between the W phase high side arm element WH and the W phase low side arm element WL are connected to the output-side conductor 52.

In the example shown in FIG. 10, the output-side conductor 51 of the first power conversion circuit section 31 is connected to a first input/output terminal Q1. The first input/output terminal Q1 is connected to a first 3-phase connector 1b. The connecting point TI of each phase of the first power conversion circuit section 31 is connected to the stator winding of each phase of the first motor 12 via the output-side conductor 51, the first input/output terminal Q1, and the first 3-phase connector 1b.

The output-side conductor 52 of the second power conversion circuit section 32 is connected to a second input/output terminal Q2. The second input/output terminal Q2 is connected to a second 3-phase connector 1c. The connecting point TI of each phase of the second power conversion circuit section 32 is connected to the stator winding of each phase of the second motor 13 via the output-side conductor 52, the second input/output terminal Q2 and the second 3-phase connector 1c.

In the example shown in FIG. 10, each of the high side arm elements UH, VH and WH and the low side arm elements UL, VL and WL of the first power conversion circuit section 31 includes a flywheel diode.

Similarly, each of the high side arm elements UH, VH and WH and the low side arm elements UL, VL and WL of the second power conversion circuit section 32 includes a flywheel diode.

In the example shown in FIG. 10, the gate drive unit 29 inputs a gate signal to each of the high side arm elements UH, VH and WH and the low side arm elements UL, VL and WL of the first power conversion circuit section 31.

Similarly, the gate drive unit 29 inputs a gate signal to each of the high side arm elements UH, VH and WH and the low side arm elements UL, VL and WL of the second power conversion circuit section 32.

The first power conversion circuit section 31 converts the direct current power input from the battery 11 via the third power conversion circuit section 33 into 3-phase alternating current power and supplies U phase current, V phase current, and W phase current, which are alternating current, to the 3-phase stator winding of the first motor 12. The second power conversion circuit section 32 converts the 3-phase alternating current power output from the 3-phase stator winding of the second motor 13 into direct current power through ON (conduction)/OFF (cutoff) driving of each of the high side arm elements UH, VH and WH and the low side arm elements UL, VL and WL of the second power conversion circuit section 32, which are synchronized with rotation of the second motor 13.

When the seven power conversion devices 1 of the first or second embodiment are used in the vehicle 10 shown in FIG. 10, a high side arm element 51 and a low side arm element S2 of the third power conversion circuit section 33 are constituted by the high side arm element UH and the low side arm element UL of the one power conversion device 1 of the first or second embodiment.

The third power conversion circuit section 33 is a voltage control unit (VCU). The third power conversion circuit section 33 includes the high side arm element S1 and the low side arm element S2, which correspond to one phase extent.

An electrode of the high side arm element S1 on a positive electrode side is connected to a positive electrode bus bar PV. The positive electrode bus bar PV is connected to the positive electrode bus bar 50p of the condenser unit 23. An electrode of the low side arm element S2 on a negative electrode side is connected to a negative electrode bus bar NV. The negative electrode bus bar NV is connected to the negative electrode bus bar 50n of the condenser unit 23. The negative electrode bus bar 50n of the condenser unit 23 is connected to the negative electrode terminal NB of the battery 11. An electrode of the high side arm element S1 on a negative electrode side is electrically connected to an electrode of the low side arm element S2 on a positive electrode side. The high side arm element S1 and the low side arm element S2 include a flywheel diode.

A bus bar 53 that constitutes a connecting point between the high side arm element S1 and the low side arm element S2 of the third power conversion circuit section 33 is connected to one end of the reactor 22. The other end of the reactor 22 is connected to the positive electrode terminal PB of the battery 11. The reactor 22 includes a coil and a temperature sensor configured to detect a temperature of the coil. The temperature sensor is connected to the electronic control unit 28 by a signal line.

The third power conversion circuit section 33 switches ON (conduction)/OFF (cutoff) of the high side arm element S1 and the low side arm element S2 on the basis of the gate signal input to the gate electrode of the high side arm element S1 and the gate electrode of the low side arm element S2 from the gate drive unit 29.

The third power conversion circuit section 33 alternately switches between a first state in which the low side arm element S2 is set to ON (conduction) and the high side arm element S1 is set to OFF (cutoff) and a second state in which the low side arm element S2 is set to OFF (cutoff) and the high side arm element S1 is set to ON (conduction) during boosting. In the first state, current flows to the positive electrode terminal PB of the battery 11, the reactor 22, the low side arm element S2, and the negative electrode terminal NB of the battery 11 in sequence, the reactor 22 is excited with direct current, and electric energy is stored. In the second state, an actuating voltage (an induction voltage) is generated between both ends of the reactor 22 such that a variation in magnetic flux due to cutoff of the current flowing through the reactor 22 is prevented. The induction voltage due to the magnetic energy stored in the reactor 22 is superimposed on the battery voltage, and a boosted voltage higher than the voltage between the terminals of the battery 11 is applied between the positive electrode bus bar PV and the negative electrode bus bar NV of the third power conversion circuit section 33.

The third power conversion circuit section 33 alternately switches between the second state and the first state during regeneration. In the second state, current flows to the positive electrode bus bar PV of the third power conversion circuit section 33, the high side arm element S1, the reactor 22, and the positive electrode terminal PB of the battery 11 in sequence, the reactor 22 is excited with direct current, and magnetic energy is stored. In the first state, an actuating voltage (an induction voltage) is generated between both ends of the reactor 22 such that a variation in magnetic flux due to cut off of the current flowing to the reactor 22 is prevented. The induction voltage due to the magnetic energy stored in the reactor 22 is dropped, and the dropped voltage lower than the voltage between the positive electrode bus bar PV and the negative electrode bus bar NV of the third power conversion circuit section 33 is applied between the positive electrode terminal PB and the negative electrode terminal NB of the battery 11.

The condenser unit 23 includes a first smoothing capacitor 41, a second smoothing capacitor 42, and a noise filter 43.

The first smoothing capacitor 41 is connected between the positive electrode terminal PB and the negative electrode terminal NB of the battery 11. The first smoothing capacitor 41 smoothes fluctuation in voltage generated according to a switching operation of ON/OFF of the high side arm element S1 and the low side arm element S2 during regeneration of the third power conversion circuit section 33.

The second smoothing capacitor 42 is connected to between the positive electrode-side conductor PI and the negative electrode-side conductor NI of each of the first power conversion circuit section 31 and the second power conversion circuit section 32 and between the positive electrode bus bar PV and the negative electrode bus bar NV of the third power conversion circuit section 33. The second smoothing capacitor 42 is connected to the plurality of positive electrode-side conductors PI and negative electrode-side conductors NI and connected to the positive electrode bus bar PV and the negative electrode bus bar NV via the positive electrode bus bar 50p and the negative electrode bus bar 50n. The second smoothing capacitor 42 smoothes fluctuation in voltage generated according to a switching operation of ON/OFF of each of the high side arm elements UH, VH and WH and the low side arm elements UL, VL and WL of the first power conversion circuit section 31 and the second power conversion circuit section 32. The second smoothing capacitor 42 smoothes fluctuation in voltage generated according to a switching operation of ON/OFF of the high side arm element S1 and the low side arm element S2 during boosting of the third power conversion circuit section 33.

The noise filter 43 is connected to between the positive electrode-side conductor PI and the negative electrode-side conductor NI of each of the first power conversion circuit section 31 and the second power conversion circuit section 32 and between the positive electrode bus bar PV and the negative electrode bus bar NV of the third power conversion circuit section 33. The noise filter 43 includes two condensers that are connected in series. A connecting point of the two condensers is connected to a body ground or the like of the vehicle 10.

The resistor 24 is connected to between the positive electrode-side conductor PI and the negative electrode-side conductor NI of each of the first power conversion circuit section 31 and the second power conversion circuit section 32 and between the positive electrode bus bar PV and the negative electrode bus bar NV of the third power conversion circuit section 33.

The first current sensor 25 forms the connecting point TI of each phase of the first power conversion circuit section 31, is disposed on the output-side conductor 51 connected to the first input/output terminal Q1, and detects current of each of the U phase, the V phase, and the W phase. The second current sensor 26 is disposed on the output-side conductor 52 connected to the second input/output terminal Q2 while forming the connecting point TI of each phase of the second power conversion circuit section 32, and detects current of each of the U phase, the V phase, and the W phase. The third current sensor 27 is disposed on the bus bar 53 connected to the reactor 22 while forming the connecting point of the high side arm element S1 and the low side arm element S2 and detects current flowing through the reactor 22.

Each of the first current sensor 25, the second current sensor 26, and the third current sensor 27 is connected to the electronic control unit 28 by a signal line.

The electronic control unit 28 controls an operation of each of the first motor 12 and the second motor 13. For example, the electronic control unit 28 is a software function part that serves as a predetermined program executed by a processor such as a central processing unit (CPU) or the like. The software function part is an electronic control unit (ECU) including a processor such as a CPU or the like, a read only memory (ROM) configured to store a program, a random access memory (RAM) configured to temporarily store data, and an electronic circuit such as a timer or the like. Further, at least a part of the electronic control unit 28 may be an integrated circuit such as large scale integration (LSI) or the like. For example, the electronic control unit 28 performs feedback control or the like of the current using a current detection value of the first current sensor 25 and a current target value according to a torque command value with respect to the first motor 12 and generates a control signal that is input to the gate drive unit 29. For example, the electronic control unit 28 performs feedback control or the like of the current using a current detection value of the second current sensor 26 and a current target value according to a regeneration command value with respect to the second motor 13 and generates a control signal that is input to the gate drive unit 29. The control signal is a signal showing a timing when each of the high side arm elements UH, VH and WH and the low side arm elements UL, VL and WL of the first power conversion circuit section 31 and the second power conversion circuit section 32 is driven to turn ON (conduction)/OFF (cutoff). For example, the control signal is a signal or the like that is pulsewidth-modulated.

The gate drive unit 29 generates a gate signal for driving each of the high side arm elements UH, VH and WH and the low side arm elements UL, VL and WL of the first power conversion circuit section 31 and the second power conversion circuit section 32 to actually turn ON (conduction)/OFF (cutoff) on the basis of the control signal received from the electronic control unit 28. For example, the gate drive unit 29 performs amplification, level shift, and so on, of the control signal and generates a gate signal.

The gate drive unit 29 generates a gate signal to drive each of the high side arm element S1 and the low side arm element S2 of the third power conversion circuit section 33 to turn ON (conduction)/OFF (cutoff). For example, the gate drive unit 29 generates a gate signal of a duty ratio according to a boosted voltage command during boosting of the third power conversion circuit section 33 or a dropped voltage command during regeneration of the third power conversion circuit section 33. The duty ratio is a ratio between the high side arm element S1 and the low side arm element S2.

In the example shown in FIG. 10, while the power conversion device 1 of the first or second embodiment is applied to the vehicle 10, in another example, the power conversion device 1 of the first or second embodiment may be applied between an alternating current motor and a direct current power source of, for example, an elevator, a pump, a fan, a railway vehicle, an air conditioner, a refrigerator, a washing machine, or the like, having an alternating current motor and a directing current power source in addition to the vehicle 10.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:
1. A power conversion device comprising:
an element array having a high side arm element and a low side arm element;
a positive electrode-side conductor electrically connected to the high side arm element;
a negative electrode-side conductor electrically connected to the low side arm element;
an output-side conductor electrically connected to the high side arm element and the low side arm element;

a high side driving signal line configured to transmit a control signal to control the high side arm element to drive the high side arm element; and a low side driving signal line configured to transmit a control signal to control the low side arm element to drive the low side arm element, wherein the positive electrode-side conductor and the negative electrode-side conductor extend from the element array toward one side of the power conversion device in a first direction, the output-side conductor extends from the element array toward an other side of the power conversion device opposite to the one side of the power conversion device in the first direction, and the high side driving signal line and the low side driving signal line extend from the element array toward a second direction crossing the first direction; and the power conversion device further comprising a first substrate and a second substrate, wherein the first substrate comprises:

a first conductive layer disposed to face an electrode of a one-side surface of the high side arm element;

a second conductive layer disposed to face an electrode of a one-side surface of the low side arm element;

a first electric insulating layer connected to the first conductive layer and the second conductive layer;

a third conductive layer disposed at a side opposite to the first conductive layer and the second conductive layer with the first electric insulating layer interposed therebetween; and a second electric insulating layer disposed at a side opposite to the first electric insulating layer with the third conductive layer interposed therebetween, the second substrate comprises:

a fourth conductive layer disposed to face an electrode of an other-side surface of the high side arm element;

a fifth conductive layer disposed to face an electrode of an other-side surface of the low side arm element; and a third electric insulating layer connected to the fourth conductive layer and the fifth conductive layer, and one of the positive electrode-side conductor and the negative electrode-side conductor is connected to any one of the first conductive layer and the second conductive layer and extends toward the one side in the first direction, the other one of the positive electrode-side conductor and the negative electrode-side conductor is connected to the third conductive layer and extends toward the one side in the first direction, and the output-side conductor is connected to the second conductive layer and extends toward the other side in the first direction.

2. The power conversion device according to claim 1, wherein the fourth conductive layer and the second conductive layer are electrically connected to each other, and the fifth conductive layer and the third conductive layer are electrically connected to each other.

3. The power conversion device according to claim 1, wherein the first substrate comprises a first heat conductive section formed of a conductive material, the first heat conductive section is disposed at a side opposite to the third conductive layer with the second electric insulating layer interposed therebetween, the second substrate comprises a second heat conductive section formed of a conductive material, and the second heat conductive section is disposed at a side opposite to the fourth conductive layer and the fifth conductive layer with the third electric insulating layer sandwiched therebetween.

4. A power conversion device comprising:

an element array having a high side arm element and a low side arm element;

a positive electrode-side conductor electrically connected to the high side arm element;

a negative electrode-side conductor electrically connected to the low side arm element;

an output-side conductor electrically connected to the high side arm element and the low side arm element;

a first substrate; and a second substrate, wherein the first substrate comprises:

a first conductive layer disposed to face an electrode of a one-side surface of the high side arm element;

a second conductive layer disposed to face an electrode of a one-side surface of the low side arm element;

a first electric insulating layer connected to the first conductive layer and the second conductive layer;

a third conductive layer disposed at a side opposite to the first conductive layer and the second conductive layer with the first electric insulating layer interposed therebetween; and a second electric insulating layer disposed at a side opposite to the first electric insulating layer with the third conductive layer interposed therebetween, and the second substrate comprises:

a fourth conductive layer disposed to face an electrode of an other-side surface of the high side arm element;

a fifth conductive layer disposed to face an electrode of an other-side surface of the low side arm element; and a third electric insulating layer connected to the fourth conductive layer and the fifth conductive layer, one of the positive electrode-side conductor and the negative electrode-side conductor is connected to any one of the first conductive layer and the second conductive layer, and the other one of the positive electrode-side conductor and the negative electrode-side conductor is connected to the third conductive layer.

* * * * *